US011303126B1

(12) United States Patent
Staver (10) Patent No.: US 11,303,126 B1
(45) Date of Patent: Apr. 12, 2022

(54) THERMAL MANAGEMENT OF POWER DELIVERY (71) Applicant: Michael Lee Staver, Lanesboro, MN (US)

(72) Inventor: Michael Lee Staver, Lanesboro, MN (US)

( * ) Notice: Subject to any disclaimer, the term of this patent is extended or adjusted under 35 U.S.C. 154(b) by 0 days.

(21) Appl. No.: 16/915,802

(22) Filed: Jun. 29, 2020

Related U.S. Application Data (63) Continuation-in-part of application No. 16/514,830, filed on Jul. 17, 2019, now abandoned, which is a continuation of application No. 15/158,819, filed on May 19, 2016, now abandoned.

(60) Provisional application No. 62/165,747, filed on May 22, 2015.

(51) Int. Cl.
H02J 3/14 (2006.01)
H01L 27/02 (2006.01)
H02J 7/00 (2006.01)

(52) U.S. Cl.
CPC ............ *H02J 3/14* (2013.01); *H01L 27/0262* (2013.01); *H02J 7/007192* (2020.01)

(58) Field of Classification Search
None
See application file for complete search history.

(56) References Cited

U.S. PATENT DOCUMENTS

| 4,513,238 | A |  | 4/1985 | Orban |
| 4,616,171 | A |  | 10/1986 | Hernandez et al. |
| 4,626,764 | A | * | 12/1986 | Weinhardt ................ H02J 7/35 320/102 |
| 4,667,143 | A |  | 5/1987 | Cooper et al. |
| 4,847,547 | A |  | 7/1989 | Eng, Jr. |
| 4,868,706 | A |  | 9/1989 | Zaderej |
| 4,982,143 | A |  | 1/1991 | Gerschner et al. |
| 5,214,370 | A |  | 5/1993 | Harm et al. |
| 5,248,927 | A |  | 9/1993 | Takei et al. |
| 5,459,391 | A |  | 10/1995 | Amano |
| 5,592,070 | A |  | 1/1997 | Mino |
| 5,640,059 | A |  | 6/1997 | Kammiller et al. |
| 5,642,030 | A |  | 6/1997 | Seelye |
| 5,874,825 | A |  | 2/1999 | Brotto |
| 6,016,048 | A |  | 1/2000 | Davidson |
| 6,020,712 | A |  | 2/2000 | Roesel, Jr. et al. |
| 6,160,389 | A |  | 12/2000 | Watts |
| 6,326,767 | B1 |  | 12/2001 | Small et al. |
| 6,404,169 | B1 |  | 6/2002 | Wang |
| 6,707,273 | B1 | * | 3/2004 | Gignac ............... H02J 7/00714 320/150 |

(Continued)

*Primary Examiner* — Jared Fureman
*Assistant Examiner* — Joel Barnett (57) ABSTRACT The power output system contains a power supply having a supply line and a return line, and controls the flow of electricity to a load based on the temperature of the power supply. It does so via a control circuit, containing a temperature sensor and a switching circuit, connected between the power supply and the load. While the power supply remains relatively cool, the system allows power to flow to the load. When the power supply exceeds a certain threshold, however, the system disconnects the power supply from the load connection and connects it to the return line, bypassing the load and stopping the flow of electricity. Once the power supply has cooled sufficiently, the system reverses the process and reconnects the power supply to the load.

20 Claims, 8 Drawing Sheets (56) References Cited

U.S. PATENT DOCUMENTS

| | | |
|---|---|---|
| 6,904,342 B2 | 6/2005 | Hanada et al. |
| 6,958,590 B1 | 10/2005 | Vaananen |
| 7,112,942 B2 | 9/2006 | Howard et al. |
| 7,221,124 B2 | 5/2007 | Howard et al. |
| 7,375,967 B2 | 5/2008 | Huang et al. |
| 7,598,710 B2 | 10/2009 | Zhang |
| 7,619,396 B2 | 11/2009 | Chuang et al. |
| 7,675,265 B2 | 3/2010 | Mori |
| 7,710,078 B2 | 5/2010 | Miller |
| 7,777,454 B2 | 8/2010 | Zhang |
| 7,834,593 B2 | 11/2010 | Johnson et al. |
| 7,893,654 B2 | 2/2011 | Huang |
| 8,035,352 B2 | 10/2011 | Zhang |
| 8,076,921 B1 | 12/2011 | Nodianos et al. |
| 8,143,864 B2 | 3/2012 | Kuo |
| 8,179,930 B2 | 5/2012 | Musio et al. |
| 8,253,387 B2 | 8/2012 | Newhouse et al. |
| 8,315,746 B2 | 11/2012 | Cox et al. |
| 8,554,389 B2 | 10/2013 | Cox et al. |
| 8,862,278 B2 | 10/2014 | Lin et al. |
| 8,918,222 B2 | 12/2014 | Higuchi et al. |
| 8,981,732 B2 | 3/2015 | Ono et al. |
| 2012/0043818 A1* | 2/2012 | Stratakos ............ H02M 3/158 307/77 |
| 2013/0033231 A1* | 2/2013 | Zhang ................. H02J 7/0031 320/116 |
| 2014/0084847 A1* | 3/2014 | Tseng ................. H02J 7/0068 320/107 |
| 2014/0266049 A1* | 9/2014 | Benckenstein, Jr .. H02J 7/0026 320/112 |

* cited by examiner

THERMAL MANAGEMENT OF POWER DELIVERY

CROSS-REFERENCE TO RELATED APPLICATIONS

The present application is a continuation-in-part of U.S. patent application Ser. No. 16/514,830, filed on Jul. 17, 2019, which is a continuation of U.S. patent application Ser. No. 15/158,819, filed on May 19, 2016, which claims priority to U.S. Provisional Patent Application No. 62/165,747, filed on May 22, 2015, the disclosure of which is hereby incorporated by reference in its entirety.

TECHNICAL FIELD

This invention relates generally to management of power delivery to a load. In particular, the present invention relates to managing power output to a load in devices such as power supplies, battery chargers, and the like.

BACKGROUND

Traditional methods for providing a consistent power output to a load, such as a rechargeable battery, come in several forms. For example, existing systems may include a large resistor placed in series with a load (e.g., a battery to be charged) such that the variation in voltage across the load does not drastically change the current draw of the charging circuit overall. This arrangement has the advantage of simplicity, however, it generally requires a long time to charge the load due to the limited current delivered to the load, and is highly inefficient, with a great deal of power consumed by the circuit in the form of heat dissipated by the resistor, rather than being supplied to the load.

An alternative solution is to use a microcomputer or other digital control system connected to thermal or electrical sensors to manipulate the power flow between the supply and the load. This method is more efficient than using a large resistor, and wastes less energy as heat. Its disadvantage; however, is its cost and complexity. Rather than using simple analog controls, this solution relies on relatively expensive digital controls that must be programmed to account for heat or voltage excesses.

In view of the above and other disadvantages of existing systems, improvements are desirable.

SUMMARY

In general, the present disclosure relates to improved management of power being provided to an electrical load. Such power to, for example, a battery is managed by using analog electrical components to measure the temperature of the power supply and to connect the power supply to ground and bypassing the load when the measured temperature exceeds a given threshold. Additional embodiments include additional features such as a voltage cut-in circuit, polarity protection, voltage regulator, or indicator lights.

In a first aspect, a power output system includes a power supply, a control circuit, and a thermal control circuit. The power supply includes a transformer, a supply line, and a return line. The control circuit includes a supply switch that includes a first silicon controlled rectifier (SCR) including an anode, a cathode, and a gate, wherein the anode of the first SCR is electrically connected to the supply line of the power supply, a load connection electrically connected to the cathode of the supply switch SCR, a control line electrically connected to the gate of the first SCR and to the supply line of the power supply. The thermal control circuit includes a voltage adjustment circuit and a thermal sensor. The voltage adjustment circuit includes an input lead electrically connected to the load connection of the supply switch, an output lead, and a first Zener diode electrically connected to the input lead, the output lead, and the return line of the power supply. The thermal sensor includes a second SCR including an anode, a cathode, and a gate. The anode of the second SCR is electrically connected to the control line of the control circuit, and the cathode of the second SCR is electrically connected to the return line of the power supply; a negative temperature coefficient thermistor, including an input lead and an output lead. The input lead of the negative temperature coefficient thermistor is electrically connected to the output lead of the voltage adjustment circuit, and the output lead of the negative temperature coefficient thermistor is electrically connected to the gate of the second SCR.

In a second aspect, a power output system including a voltage regulation circuit is described. The voltage regulation circuit includes a silicon controlled rectifier (SCR), a potentiometer, and a Zener diode. The SCR including an anode, a cathode, and a gate, wherein the anode of the controlled rectifier SCR is electrically connected to the control line of the control circuit, and the cathode of the controlled rectifier SCR is electrically connected to the return line of the power supply. The potentiometer includes an input terminal, an output terminal, and a ground terminal. The input terminal of the potentiometer is electrically connected to the load connection of the control circuit and the ground terminal of the potentiometer is electrically connected to the return line of the power supply. The Zener diode includes an anode and a cathode. The anode of the Zener diode is electrically connected through a first resistor to the return line of the power supply and the anode of the Zener diode is electrically connected through a second resistor to the gate of the first SCR, and the cathode of the Zener diode is electrically connected to the output terminal of the voltage regulation circuit potentiometer.

In a third aspect, power output system comprising a voltage cut in (VCI) is described. The VCI circuit includes a first silicon controlled rectifier (SCR) including an anode, a cathode, and a gate. The anode of the voltage regulation SCR is electrically connected to the control line of the control circuit, and the cathode of the first SCR is electrically connected to the return line of the power supply. A VCI control line is electrically connected between the supply line of the power supply and the gate of the first SCR. A first Zener diode includes an anode and a cathode, and the cathode of the first Zener diode is electrically connected to the load connection of the control circuit. An electrical switch includes a collector, an emitter, and a base. The collector of the electrical switch is electrically connected to the VCI control line, the emitter of the electrical switch is electrically connected to the return line of power supply, and the base of the electrical switch is electrically connected to the anode of the second Zener diode.

In a fourth aspect, a power output system including a voltage regulation indication circuit is described. The voltage regulation indication circuit includes a first switch comprising a mosfet including a drain, a source, and a gate. The drain is electrically connected to a control, the source is electrically connected to the return line of the power supply, and the gate is electrically connected to a first control. The first control comprises a Zener diode including an anode and a cathode. The anode is electrically connected to the return line of the power supply and the rectifier supply line. The cathode is connected to the output of a voltage divider and the voltage divider input. A capacitor is electrically connected to the return line, wherein the first control is capable of receiving an input from a power source through a diode including an anode and a cathode. The anode of the diode is electrically connected to the power supply line and the cathode is electrically connected to the voltage divider input. The voltage divider is also electrically connected to the return line of the power supply.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

The following drawings are illustrative of particular embodiments of the present disclosure and therefore do not limit the scope of the present disclosure. The drawings are not to scale and are intended for use in conjunction with the explanations in the following detailed description. Embodiments of the present disclosure will hereinafter be described in conjunction with the appended drawings, wherein like numerals denote like elements.

DETAILED DESCRIPTION OF THE DRAWINGS

The figures and descriptions provided herein may have been simplified to illustrate aspects that are relevant for a clear understanding of the herein described devices, systems, and methods, while eliminating, for the purpose of clarity, other aspects that may be found in typical devices, systems, and methods. Those of ordinary skill may recognize that other elements and/or operations may be desirable and/or necessary to implement the devices, systems, and methods described herein. Because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Embodiments of the present invention, for example, are described above with reference to block diagrams and/or operational illustrations of methods, systems, and computer program products according to embodiments of the invention. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The embodiments described herein may, in some cases, eliminate or reduce the need of a current limiting resistor and the low power output of phase controlling. The negative effects of extra components and the need for additional power dissipation, as required by the use of a power resistor, may be reduced or eliminated. Furthermore, additional heat-sinking apparatus may not be needed. This device can be built at very low cost and built with a small footprint. Additionally, the circuitry may also be digitized or processor controlled.

In power delivery systems, where power sources can overheat due to inadequate heat dissipation, it becomes necessary to regulate the power output of the power source. This can be seen, for example, when a power source such as a transformer, is placed in a small enclosure and connects an output to a load. If the enclosure cannot dissipate the heat generated by the power source, the temperature will rise and may exceed design limits, which could lead to a failure. One solution to this problem is to limit output of the power source. However, this has the drawback of lower power output. Additionally, some traditional methods of current limiting can cause more heat within the system. Heat dissipation is further influenced by the outside temperature of the device containing the power source. As the ambient temperature of the device increases, the internal device temperature increases, conversely, as ambient temperature decreases, the internal device temperature decreases. Thus, in cooler ambient temperatures, higher output of the transformer can be maintained.

It can be useful to control output of a power delivery system based upon the internal device temperature. A temperature sensor that has a rising and falling resistance or rising and falling voltage based on temperature may be useful. The temperature sensor is configured to produce a rising and falling voltage in a voltage divider circuit to electrically connect and disconnect an electronic power switch from a load and connect it to the return line.

Another solution to the problem can be accomplished by controlling the transformer output based upon the transformer temperature. As a predetermined temperature of the transformer is reached, the transformer is switched off until it cools enough to resume output and the cycle continues back and forth. Using this method, tests have shown in cooler ambient device temperatures the output of the transformer remains on longer with a given load, (in some cases indefinitely), because of the increase in heat dissipation the cooler ambient temperature affords.

It can be useful to control output of a power delivery system based upon an input voltage. The power output systems described herein uses any electronic components that can act as a voltage sensor that can output voltage at a specific voltage threshold to electrically connect and disconnect an electronic power switch from a load based upon input voltage. For example, the power delivery system could be used in battery charging to prevent connecting to a battery with too low voltage and/or to prevent a spark due to shorting the chargers' leads.

As stated above, ambient temperature can play a role to internal device temperatures. Many electronic components have electrical characteristics that can change with temperature changes. Zener diodes can be configured to sense the internal temperature of a power output system, which can be dependent on ambient device temperature influence and at a threshold voltage can electrically connect and disconnect an electronic power switch from a load. Temperature compensation can be accomplished by using electronic components that contain thermal characteristics conducive to adjust output voltage within a power output system based on temperature.

This disclosure includes a set of three sub-circuits designed to solve certain problems within a power delivery system. The first sub-circuit provides a way to turn on and off a power system based on temperature, the second sub-circuit shows a way to turn on and off a power delivery system based on an input voltage, and the third sub-circuit includes a voltage regulator that is temperature compensated. These sub-circuits can be used independently or in any combination together. It is within the scope of this disclosure to have a single power source or multiple power sources within a power delivery system. A load contained within the text and drawings may be a rechargeable battery if the circuit is used in battery charging.

Figure 1:
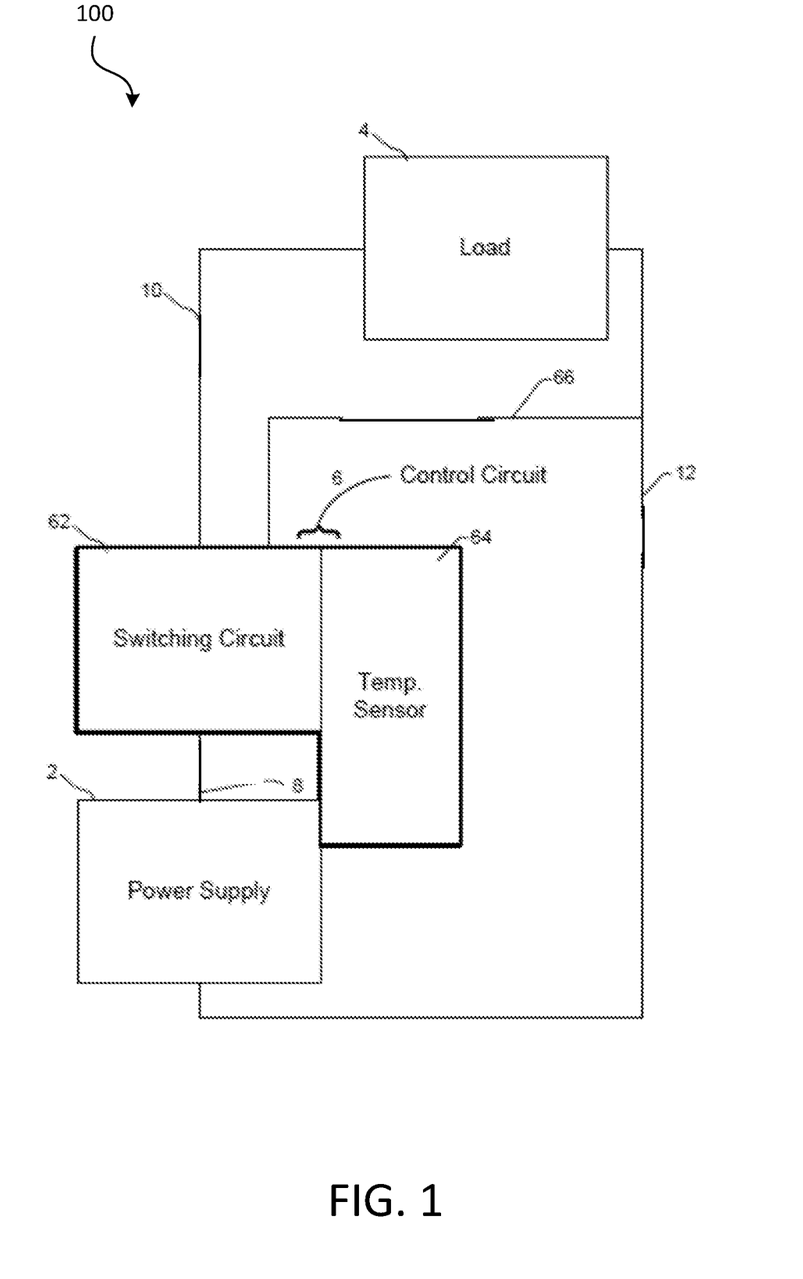
FIG. 1 illustrates a simplified, overall view of the main elements of a power delivery system.

Referring first to FIG. 1, a simplified block diagram of a control circuit 100 is shown including the elements of one embodiment of the present disclosure. The power supply 2 may be a transformer or other power supply device. Power is supplied by power supply 2 via a supply line 8, which is electrically connected to a load connection 10 and a return line 12 via a control circuit 6. The control circuit 100 includes at least a temperature sensor 64 and a switching circuit 62. The load connection 10 provides connection between the switching circuit 62 and a load 4. The load 4 may be a battery to be charged or any other electrical device capable of receiving intermittent power. A return line 12 connects between the load 4 and the power supply 2, completing the circuit. The switching circuit 62 also connects to the return line 12 via a return path 66.

The control circuit 6 is connected to the power supply 2 to either the load 4 or to the return line 12, depending on the temperature of the power supply 2. When the temperature sensor 64 detects that the power supply 2 is below a certain temperature level, it connects the supply line 8 to the load connection 10, allowing power to flow between the power supply 2 and the load 4. When the temperature of the power supply 2 exceeds the chosen temperature, the switching circuit 62 will disconnect the supply line 8 from the load connection 10 and connect it to the return path 66, and removing power from the load 4. Once the power supply temperature has dropped below the acceptable level, the switching circuit 62 disconnects the supply line 8 from the return path 66 and reconnects it to the load connection 10, once again allowing power to flow to the load 4.

Figure 2:
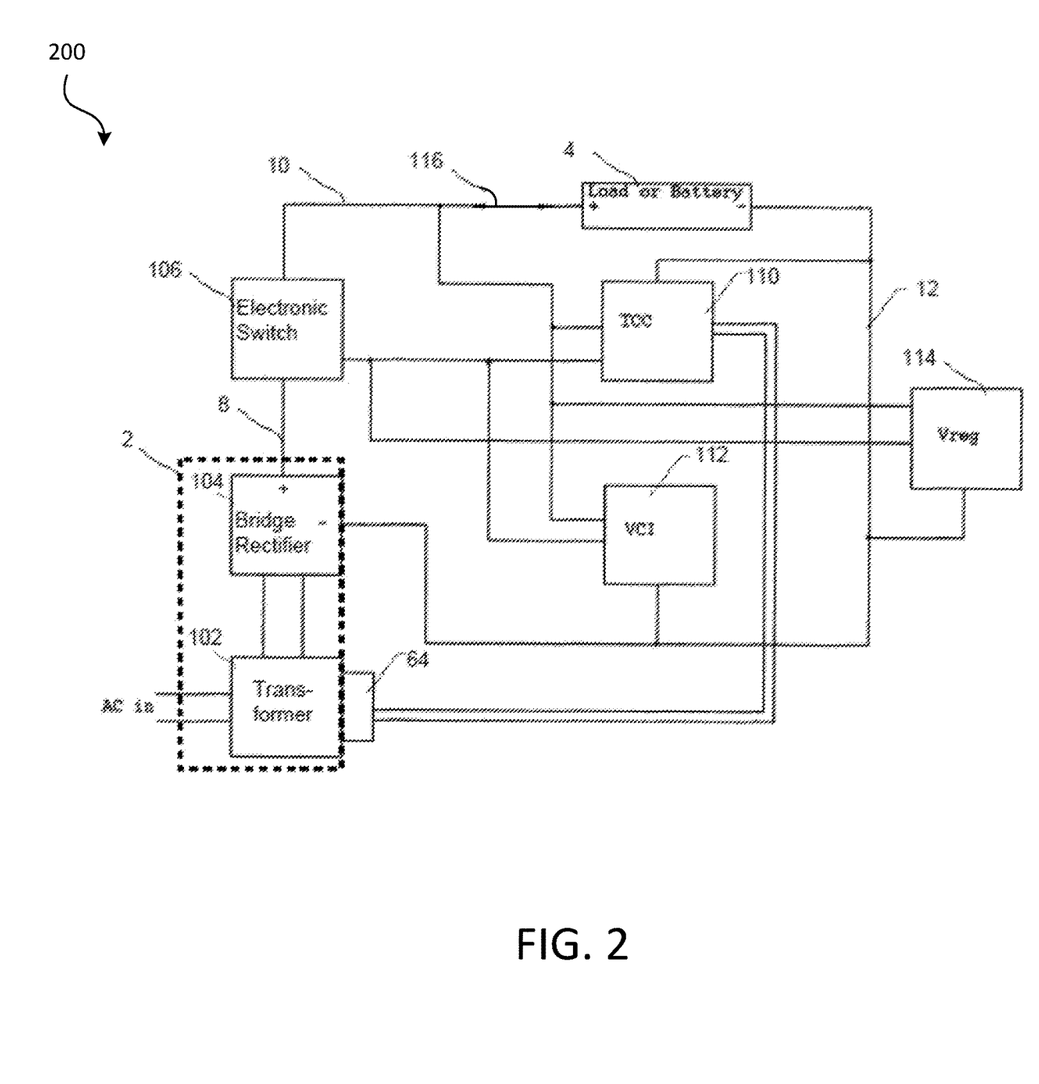
FIG. 2 is a block diagram of an embodiment of the power delivery system, including additional elements such as a Voltage Cut-In (VCI) circuit and a Voltage Regulation (VReg) Circuit.

Referring now to FIG. 2, a simplified block diagram of another embodiment of a power output system 200 is provided. In the embodiment shown, the power supply 2 includes a transformer 102 and a bridge rectifier 104. The power supply 2 is connected to an electrical switch 106, which is further connected to a load 4. The connection between the electrical switch 106 and load 4 optionally includes a fuse 116. In the embodiment shown, power flows out of the power supply 2 through an electrical switch 106, through a load 4 and back to the power supply 2. Under normal circumstances, the load will regulate current levels between the power supply 2 and said load 4.

A temperature sensor 64 is included in, near, or on the power supply 2. A thermal control circuit 110 is connected to the temperature sensor 64 and electrical switch 106 capable of bypassing the power supply 2 to the return line based on temperature. As ambient temperature rises, the power supply line 109 is bypassed. If the transformer output and temperature are high and the ambient temperature is cold, the output of the transformer could be maintained.

Fuse 116 is installed between the power supply 2 and load 4 for over-current protection. Those skilled in the art may determine fuse size for their given design.

As previously noted, the thermal control circuit 110 employs a temperature sensor 64 in, on, or very near the power supply 2. As the thermal control circuit 110 responds to the changing output of the temperature sensor, it controls the electrical switch 106 to connect the power supply to the load 4 or to the return line 12. Accordingly, the thermal control circuit 110 may contain or be connected to additional voltage regulation. A low voltage regulation ensures consistent temperature control through most voltage ranges the thermal control circuitry may encounter in a given design.

A voltage cut-in circuit 112 may be connected to the load connection 10, the electrical switch 106 and the return line 12. The voltage cut-in circuit 112 is useful when the system is used in battery charging. The voltage cut-in circuit 112 will turn the electrical switch 106 on and off in relation to the cut-in battery voltage. When the voltage is below a certain threshold, the voltage cut-in circuit 112 will disconnect the supply line of the power supply from the load connection and electrically connect the supply line to the return path, bypassing the load connection. A voltage cut-in circuit 112 can be used to control when the power supply 2 will begin outputting based on design limits. For example, a design limit value of 2.0 V would mean the power supply 2 would provide no power output until battery voltage is at or above 2.0 V. Additionally, the voltage cut-in circuit 112 can be set slightly higher than the thermal control circuit 110 regulation voltage stated above, to provide even temperature control through most voltage ranges the system might encounter in a given application. In an embodiment, if a battery's state of charge is low, more power supply 2 output will be demanded. Therefore, by setting the voltage cut-in circuit 112 design limit, the voltage cut-in circuit 112 can lower high current exposure of the power supply 2. When equipped with the voltage cut-in circuit 112, and the voltage is below voltage cut-in set point, the supply line 8 or load connection 10 can be shorted with no consequence.

A voltage regulation circuit 114 may be connected to electrical switch 106, load connection 10, and return line 12. The voltage regulation circuit 114 shown may be used when the system is being used as a battery float charger or battery maintainer. These devices are chargers meant to be left on a battery to keep the battery completely charged at all times by maintaining a specific charge voltage. A voltage regulation circuit 114 may be added to the system with voltage cut-in battery charger circuit as shown, and would keep the battery charge voltage stable at, for example, 13.5 volts.

In an embodiment, the internal temperature change is related to the ambient temperature change. The output voltage of the device can be changed based on internal device temperature using a voltage regulation/temperature compensation circuit described in more detail below. As the internal temperature rises or falls, the output voltage can be designed to rise or fall based on Zener diode selection. When Zener diodes are configured to output a voltage threshold as the voltage rises on its cathode the output voltage rises on its anode. The output voltage on the anode of the Zener diode either rises or falls slightly with temperature depending upon the temperature coefficient.

Temperature sensor 64 may be in, on, or very near power supply 2 to sense a temperature of the power supply 2. In one case, temperature sensor 64 is a radial through-hole design sensor soldered to the printed circuit board (PCB) in a position directly touching a transformer core of the power supply 2. In such a configuration, the temperature sensor 64 sensing bead may be covered with appropriate high temperature sealer to insulate it from ambient influences. Temperature sensor 64 mounting must provide accurate power supply 2 temperature levels, and the thermal control circuit 110 must be set to cut in and out at realistic levels.

When using a transformer in the power supply, one skilled in the art may properly select a transformer for his or her application. Additionally, there are many different voltages, types, styles and configurations of transformers that could work in the scope of this design. Some configurations include single or dual primaries, single or dual secondaries, center tapped, or other similar configurations.

One skilled in the art can determine desired values and adapt the system to his or her device application. In addition, many electronic components may be interchanged to provide the same results. For example, BJTs, mosfets, thyristors, also temperature sensors, RTDs, temperature switches, etc. may be used as temperature sensors. The temperature sensor 64 may be any temperature device whose resistance changes with temperature.

Figure 3:
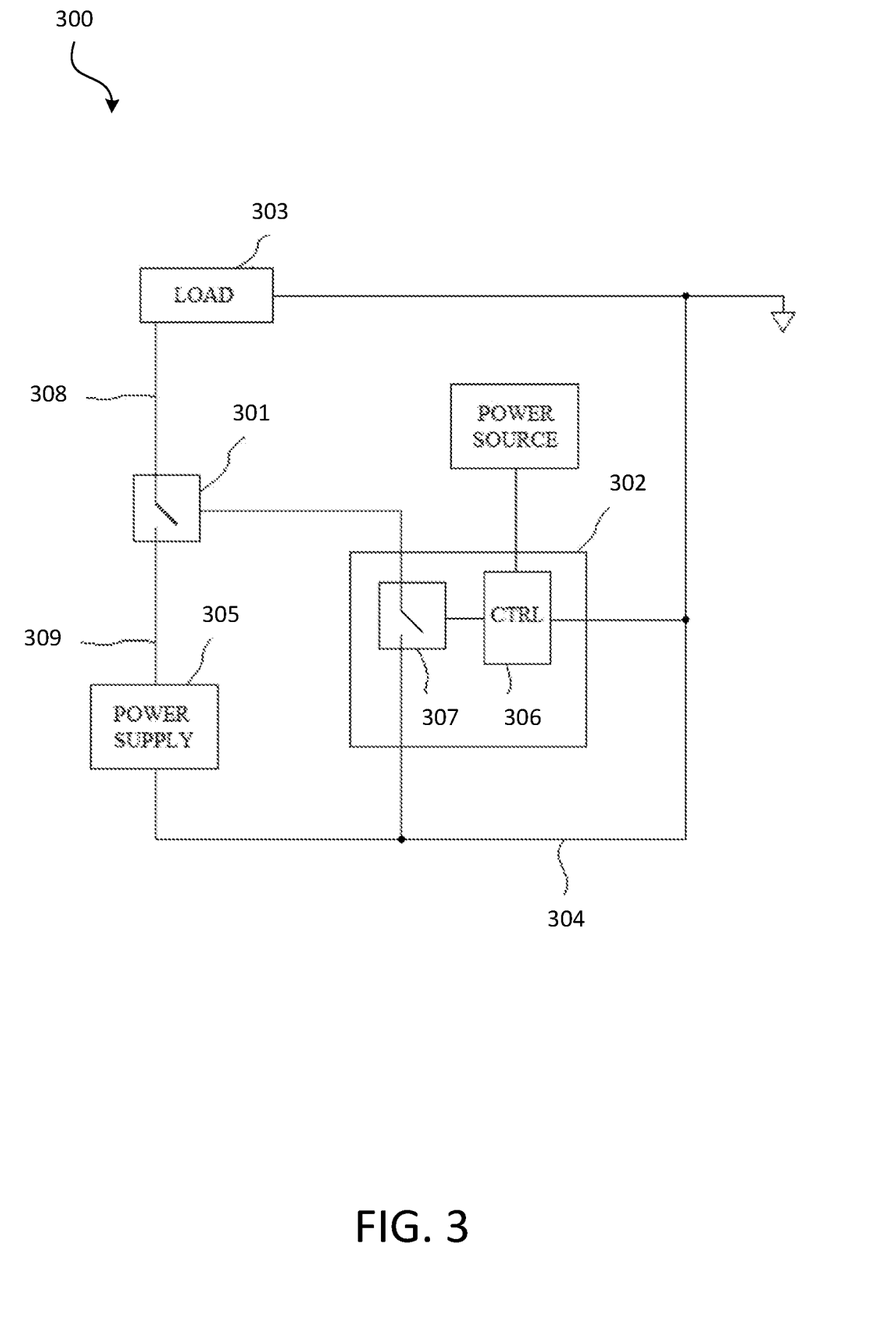
FIG. 3 is a block diagram of an embodiment of a thermal control circuit.

Referring now to FIG. 3, a block diagram of a power output system 300 is shown. The power output system 300 is configured to operate with power supplies having a rectified DC output. The power output system 300 includes a temperature control module 302. The power supply 305 may be a transformer or other power supply device. Power is supplied by power supply 305 via a supply line 309, which is electrically connected to a load 303 and a return line 304. Power supply 305 may or may not include a rectifier bridge. In an embodiment, power supply 305 may be a battery.

The temperature control module 302 includes a switch 307 and a control 306. The switch 307 is electrically connected to the control of power switch 301 and the return line 304. The switch 307 is also electrically connected to the control 306. In an embodiment, control 306 contains a Zener diode configured to provide voltage regulation. Control 306 contains a resistive type temperature sensor. The temperature sensor may be electrically connected to a power source and form a top end of a voltage divider configured to produce a threshold voltage. Switch 307 on its control is electrically connected to the voltage divider within control 306. The bottom half of the divider is formed by a resistor electrically connected to the temperature sensor in control 306, the control of switch 307, and the return line 304. Control 306 may also be an IC like a PTAT which has a rising and falling voltage based on temperature connected in a divider circuit as described to accomplish the same thing. Power switch 301 on its switch contact is electrically connected to the load supply line 308 and power supply line 309. The load 303 is electrically connected to load supply line 308 and return line 304.

As ambient temperature rises, the internal temperature in the power output system 300 can rise especially if the power output system 300 is small and or air tight with no added cooling apparatus. The effect of the temperature control module 302 (under high transformer temperature and higher ambient temperatures) could bypass the power supply line 309 to the return line 304. If the transformer output and transformer temperature are high and the ambient temperature is cold, the output of the transformer can be maintained longer because there is a greater heat transfer due to the cooler ambient temp. When the output of the transformer is low, its heat output is low. In addition, voltage regulation capability may be added to the power source in the power output system 300 to provide temperature control through various voltage ranges.

When using a negative coefficient temperature sensor, and the temperature of the thermal sensor is low, its resistance will be high, causing a low voltage to flow from the divider to switch 307 when configured as described. If this voltage output is below the set point of switch 307, it will be in a nonconductive state and power will continue to flow through power switch 301, thereby allowing power to continue to the load.

As the temperature of the thermal sensor increases, its resistance will decrease, thus causing the voltage output from the divider to increase. As the voltage increases, it will exceed the set point of switch 307, causing the switch 307 to conduct bypassing power supply line 309 to the return line 304, thereby pulling the power switch 301 into non-conductance. This causes power flow from the transformer to the load 303 to cease. The above-described cycling will repeat whenever the temperature of the transformer is high enough to reach the set point of the switch 307.

Figure 4:
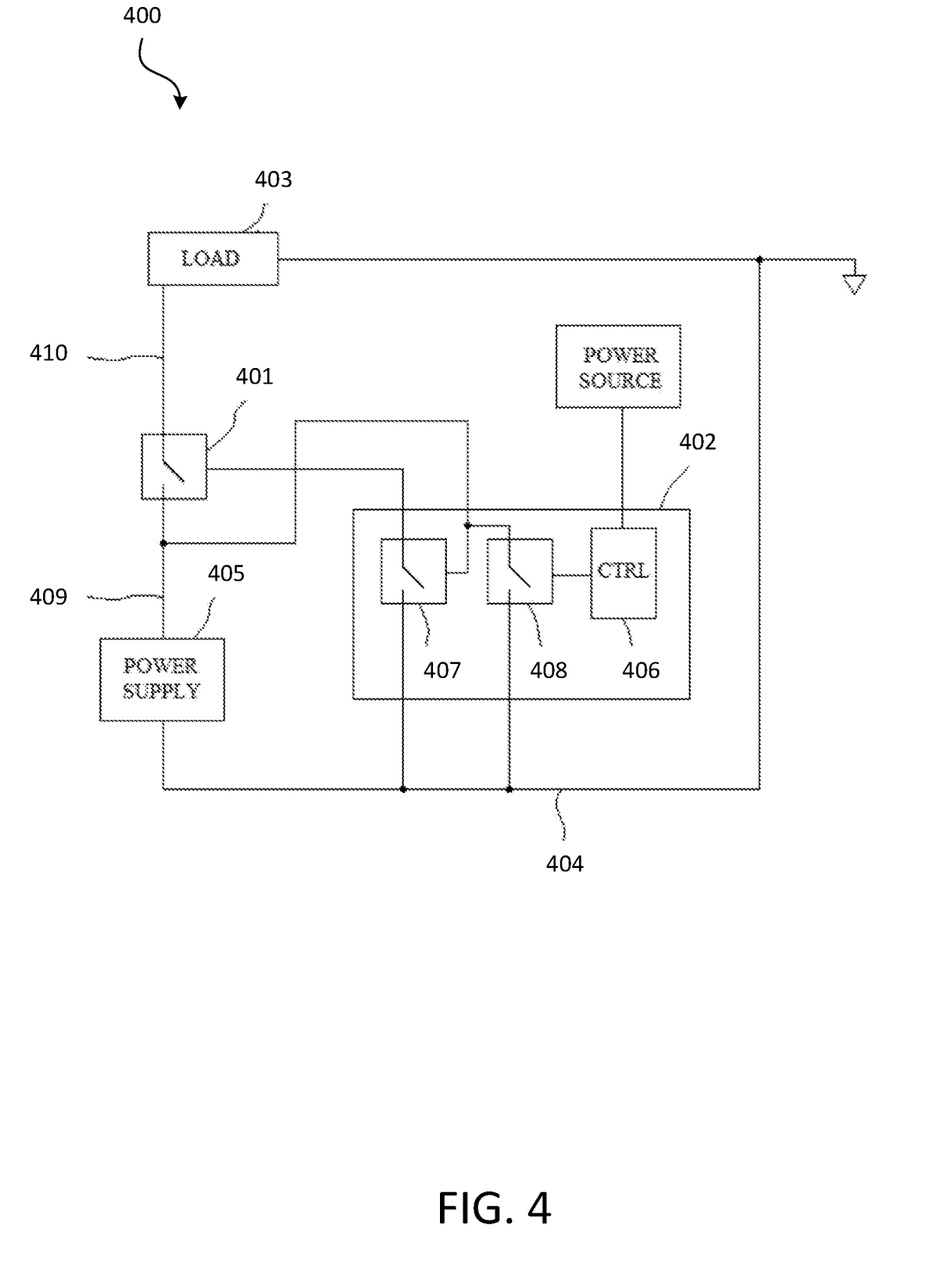
FIG. 4 is a block diagram of an embodiment of a voltage cut in circuit.

Referring now to FIG. 4, a block diagram of a voltage cut-in circuit 400 is shown. The voltage cut-in circuit 400 is configured to operate with power supplies having a rectified DC output. The voltage cut-in circuit 400 includes a voltage control module 402 that contains a switch 407, a switch 408, and a control 406. The power supply 405 may be a transformer or other power supply device. Power is supplied by power supply 405 via a supply line 409, which is electrically connected to a load 403 and a return line 404. Power supply 405 may or may not include a rectifier bridge.

The switch 407 is electrically connected to the control of power switch 401 and the return line 404. The switch 407 on its control is electrically connected to the power supply line 409 and to a switch contact of switch 408. Control 406 contains a voltage sensor configured to output a voltage threshold. The voltage sensor is electrically connected to a voltage source and the control of switch 408. The switch 408 is electrically connected to power supply line 409, the control of switch 407, and the return line 404. Power switch 401 is electrically connected to the load supply line 410 and power supply line 409. The load 403 is electrically connected to load supply line 410 and return line 404.

The voltage cut-in circuit 400 can provide a voltage cut in to prevent charging a battery that has too low of standing voltage. Additionally, the voltage cut-in circuit 400 can provide short circuit protection or sparkless condition if the output of the power supply is shorted. The voltage cut-in circuit 400 is useful for battery charging. The voltage cut-in circuit 400 will turn the main power switch 401 on and off in relation to the cut-in battery voltage. A voltage cut-in design limit can be used to control when the transformer will begin outputting based on design limits. In an example embodiment, the voltage limit may be 2.0 V. At this limit, the transformer output remains bypassed (no power output to the load) until the battery voltage is at or above 2.0 V. Additionally, the voltage cut-in circuit 400 cut-in value can be set slightly higher than the temperature control regulation voltage, so as to provide even temperature control through most voltage ranges. Additionally, as a battery's capacity changes (for example, lowers) more transformer output will be demanded. By setting the voltage cut-in circuit 400 design limit, the voltage cut-in circuit 400 can lower high current exposure of the transformer. When equipped with a voltage cut-in circuit 400, the output leads of the power supply could be shorted with no consequence, if there were no battery volts sensed on the output leads.

Figure 5:
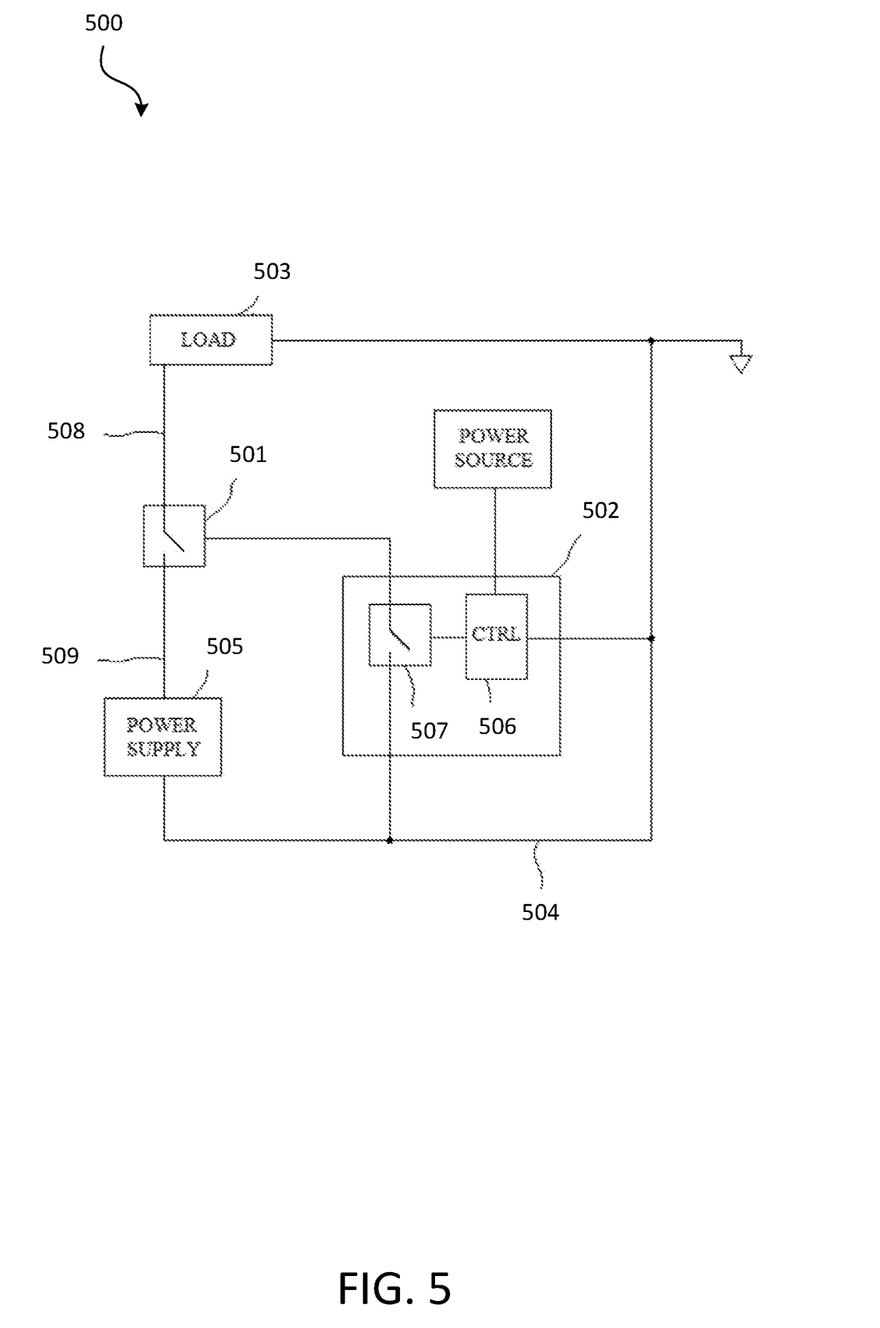
FIG. 5 is a block diagram of an embodiment of a voltage regulation circuit.

In an embodiment, the internal temperature change is related to the ambient temperature change. The output voltage of the device can be changed based on internal device temperature using the voltage regulation/temperature compensation circuit 500. In an example embodiment, a Zener diode is disclosed; however, other components may be substituted. As the internal temperature rises or falls, the output voltage can be designed to rise or fall based on Zener diode selection. When Zener diodes are configured to output a voltage threshold as the voltage rises on its cathode the output voltage rises on its anode. The output voltage on the anode of the Zener diode either rises or falls slightly with temperature depending upon the temperature coefficient.

Referring to FIG. 5, an electrical diagram of a voltage regulation (Vreg) circuit 500 is shown. The Vreg circuit 500 is configured to operate with power supplies having a rectified DC output. In some embodiments, the Vreg circuit 500 may be used in applications that require voltage regulation. An example of such an application would be a battery float charger or similar device. A voltage regulation temperature compensation module 502 contains a switch 507 and a control 506. The power supply 505 may be a transformer or other power supply device. Power is supplied by power supply 505 via a supply line 509, which is electrically connected to a load 503 and a return line 504. Power supply 505 may or may not include a rectifier bridge.

The switch 507, on its switch contacts, is electrically connected to the control of 501 and return line 504. Switch 507 is electrically connected to the control 506. Control 506 contains a voltage divider/potentiometer electrically connected to a power source, a Zener diode, and the return line 504. The Zener diode contained within control 506 is configured to output a voltage threshold. The Zener diode on its cathode, is electrically connected to the Vout of the voltage divider. The Zener diode is electrically connected, on its anode, to the control of switch 507. Control 506 contains a first resistor electrically connected to the anode of the Zener diode contained within 506 and to the return line 504 and an optional second resistor electrically connected to the anode of the Zener diode and electrically connected to the control of switch 507.

Temperature compensation may be achieved inside the Vreg circuit 500 by utilizing the temperature coefficient found in Zener diodes. For example, one may use a Zener diode with a positive temperature coefficient (i.e. the Zener diode's Vz voltage output rises with temperature). As the ambient temperature of the device rises, the internal temperature of the TPM system and components also rises. As this temperature rises, the output voltage of Zener diode Vz rises slightly. As this voltage rises, output of the Zener diode will be slightly higher, and its output voltage will bring switch 507 into conductance, which causes switch 501 to be non-conductive, similar to the process described above. This ensures that the system's regulated float voltage output will be slightly lower when the system is warm and in "'float". Conversely, if the ambient temperature of the system is cool when in float, the output voltage will be higher.

If a low resistance value is used for resistor Vz Iz, the output voltage swing of the Zener diode will be small or none. Conversely, if the R value of resistor Vz Iz is too high, the output voltage swing of the Zener diode will be high or unaffected.

With regard to grounding, the national electrical code (NEC) is most often consulted in grounding requirements. Class 2 transformers are widely used. Some devices do not require grounding. If the TPM System is used on a device that requires grounding, the grounding requirements of that design would have to be met as well.

As stated previously, a person of skill in the art may calculate individual component values for components of a system consistent with the present disclosure. The components will have different values if as a load one is controlling a 12V 30 ohm water valve as opposed to a 48V 4.8 ohm heat element. Alternatively, when used in a battery charger, the component values would be different for charging a 6V 1 amp hour battery verses a 24V 200 amp hour battery. Selection of appropriate component values is within the skill of one of skill in the art.

As stated previously, electronic components may be interchanged in some cases while accomplishing the same or desired effect, for example, one may use bipolar junction transistors (BJTs), thyristors, and field effect transistors (FETs), to accomplish the same result in many cases. In the embodiments described herein, the switches are silicone controlled rectifiers, an NPN BJT, an N channel mosfet. Additionally, thermal sensor used herein is an NTC thermistor.

Figure 6:
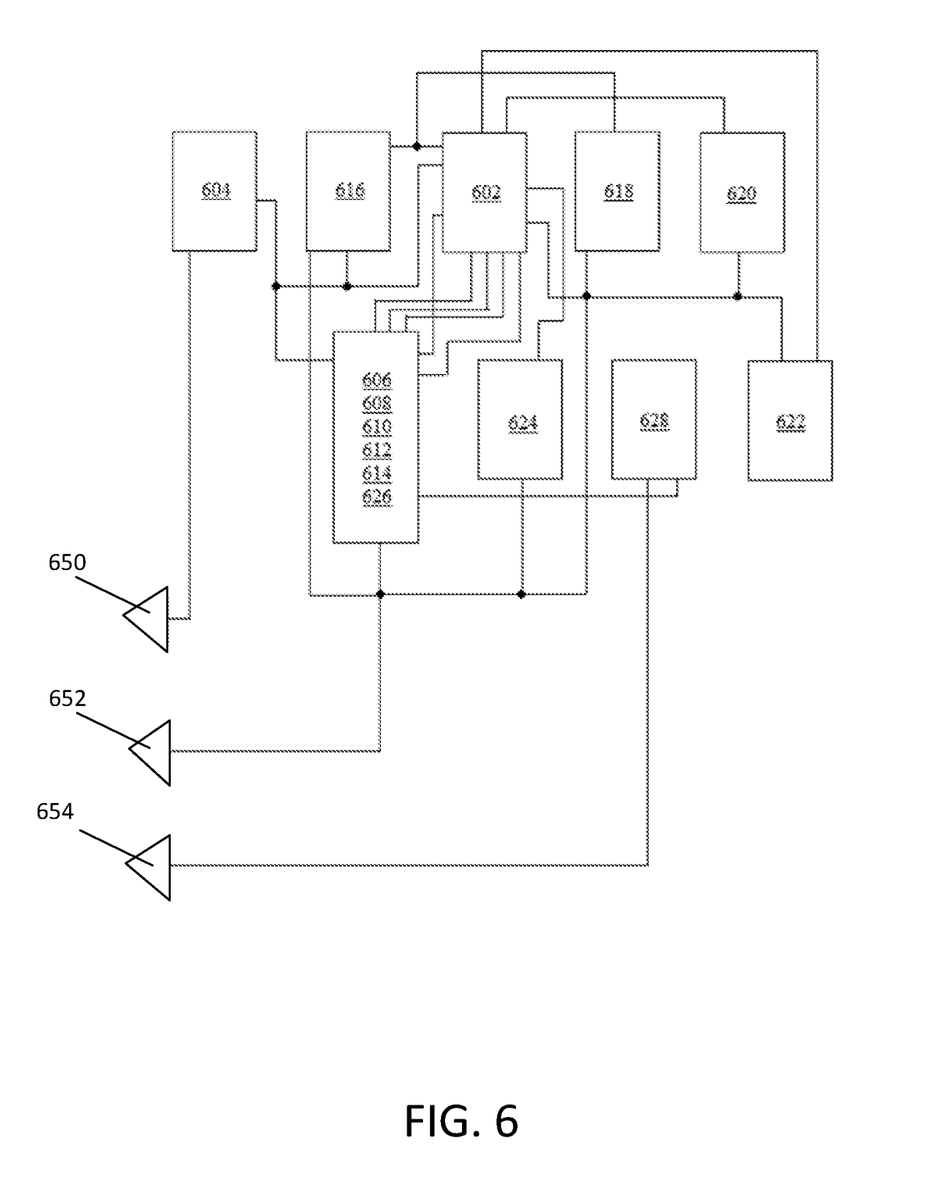
FIG. 6 is a circuit diagram showing indicator lights via an LED driver.

Referring to FIG. 6, an electrical diagram showing indicator lights that may be connected to the embodiment described herein. The lights may indicate the operational status of the disclosed embodiment. In an embodiment, the IC 602 turns on or off LEDs 606 in succession based on predetermined or programed voltage levels set by the external components shown. LEDs 606 may comprise a plurality of individual LEDs that turn on or off individually from one another. Voltage is applied to a diode 604, to the IC 602, to the LEDs 606, 608, 610, 612, 614, and to a variable resistor 616. The diode 604 is used for reverse blocking. Diode 604 is also connected to ground 650. Power flows through the variable resistor 616 and out to the IC 602. Power also flows through the variable resistor 616 and to a ground 652. IC 602 is also connected to the ground 652.

In an embodiment, a capacitor is connected to the IC 602 and to the ground 652, which functions to "soften" the voltage change on IC 602. The voltage at the IC 602 may change because of changes to battery supply voltage applied at IC 602. The resistor 620 functions to set the low end voltage ref of IC 602. Another resistor 622 sets the reference adjust to IC 602. Resistors 620, 622 are connected to a ground 652. In an embodiment, resistor 620 may include a plurality of resistors. Resistor 624 can also set the reference high input and is used to set the LED current.

IC 602 also sets the IC in bar mode, where the preceding lights stay on, or dot mode where the preceding lights turn off as the lights ascend. Voltage of IC 602 sets IC 602 in bar mode. The IC 602 also grounds the LEDs 606, 608, 610, 612, 614. A voltage input 654 for LED 626 flows through a resistor 628 to LED 626 to the ground 652.

Figure 7:
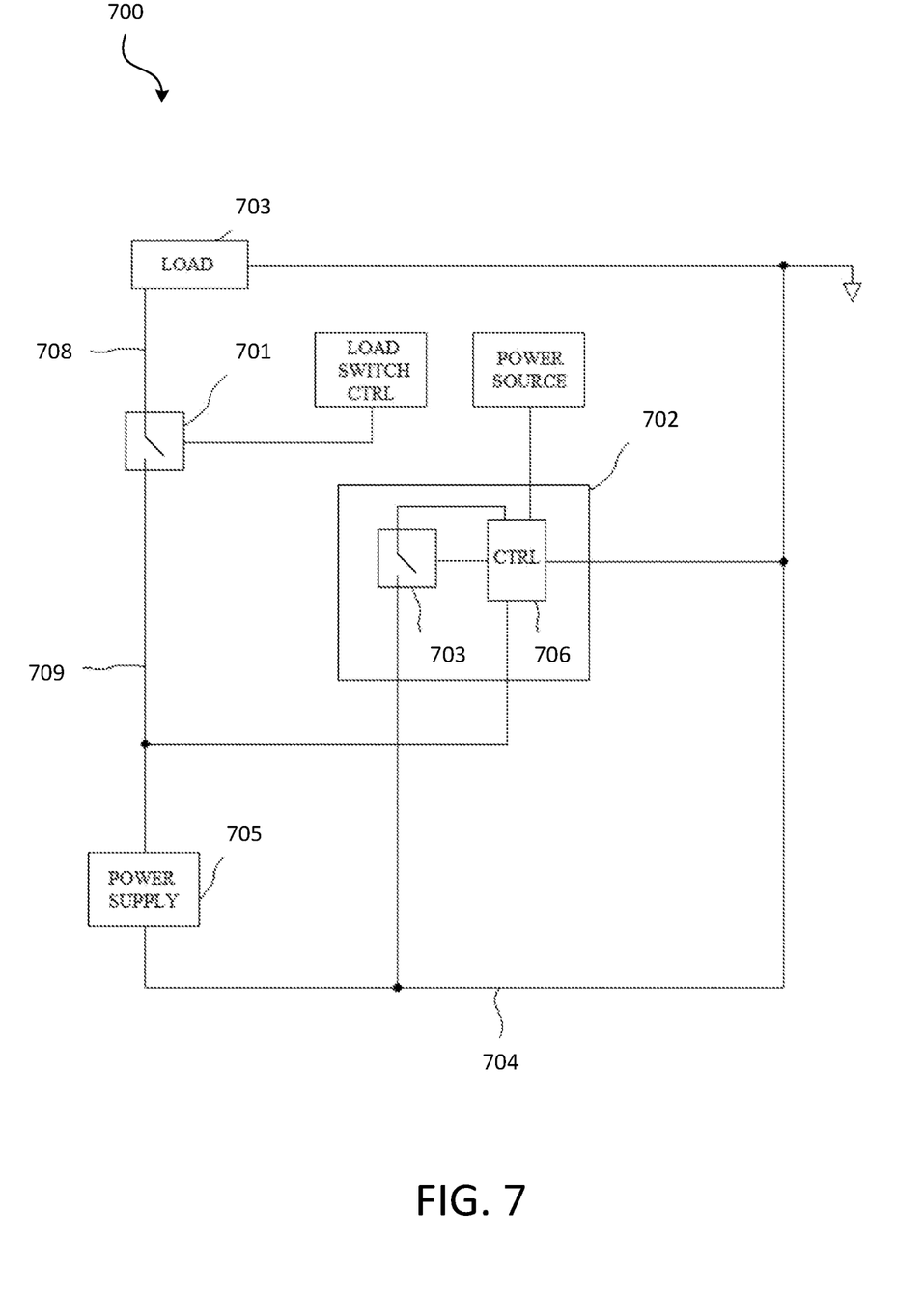
FIG. 7 is a block diagram of an embodiment of a voltage indication circuit

FIG. 7 shows a block diagram of an indicator device 700. The indicator device 700 is configured to operate with power supplies having a rectified DC output. The indicator device includes an indicator control module 702 that contains a switch 703 and a control 706. Switch 703 is electrically connected to control 706 and to the return line 704. The control of switch 703 is electrically connected to control 706. Control 706 is electrically connected to power supply line 709, a power source, the return line 704, a switch contact of switch 703, and the control of switch 703. Control 706 contains a standard diode and its anode is electrically connected to the power supply line 709. The cathode is electrically connected to input a voltage divider, which is configured to produce a threshold voltage on its output. The divider is also electrically connected to the return line 704. The output of the voltage divider is electrically connected to the cathode of a Zener diode and to a capacitor that is connected to the return line 704. The anode of the Zener diode is electrically connected to the control of switch 703 and to a resistor. The resistor is electrically connected to the return line 704. Additionally, control 706 contains an input from a power source that is connected to an indicator light within control 706. The indicator light is then electrically connected to a switch contact of switch 703. Switch 703 can be an N channel mosfet with a gate, drain, and source.

The indicator device 700 can be used with power supply regulators, such as for voltage regulation and thermal regulation. Within power systems that are used to supply power, it can be useful to have an indication that the power system is in regulation. The indicator device 700 can indicate voltage regulation in typical power supplies that have a pulsing DC sign wave output. These power supplies have a higher voltage output when they are in regulation. Conversely, the voltage output is lower when the power supply is connected to the load. This voltage difference can be used to indicate regulation. In an example, the load in the indicator device 700 may be a rechargeable battery if used in battery charging.

Figure 8:
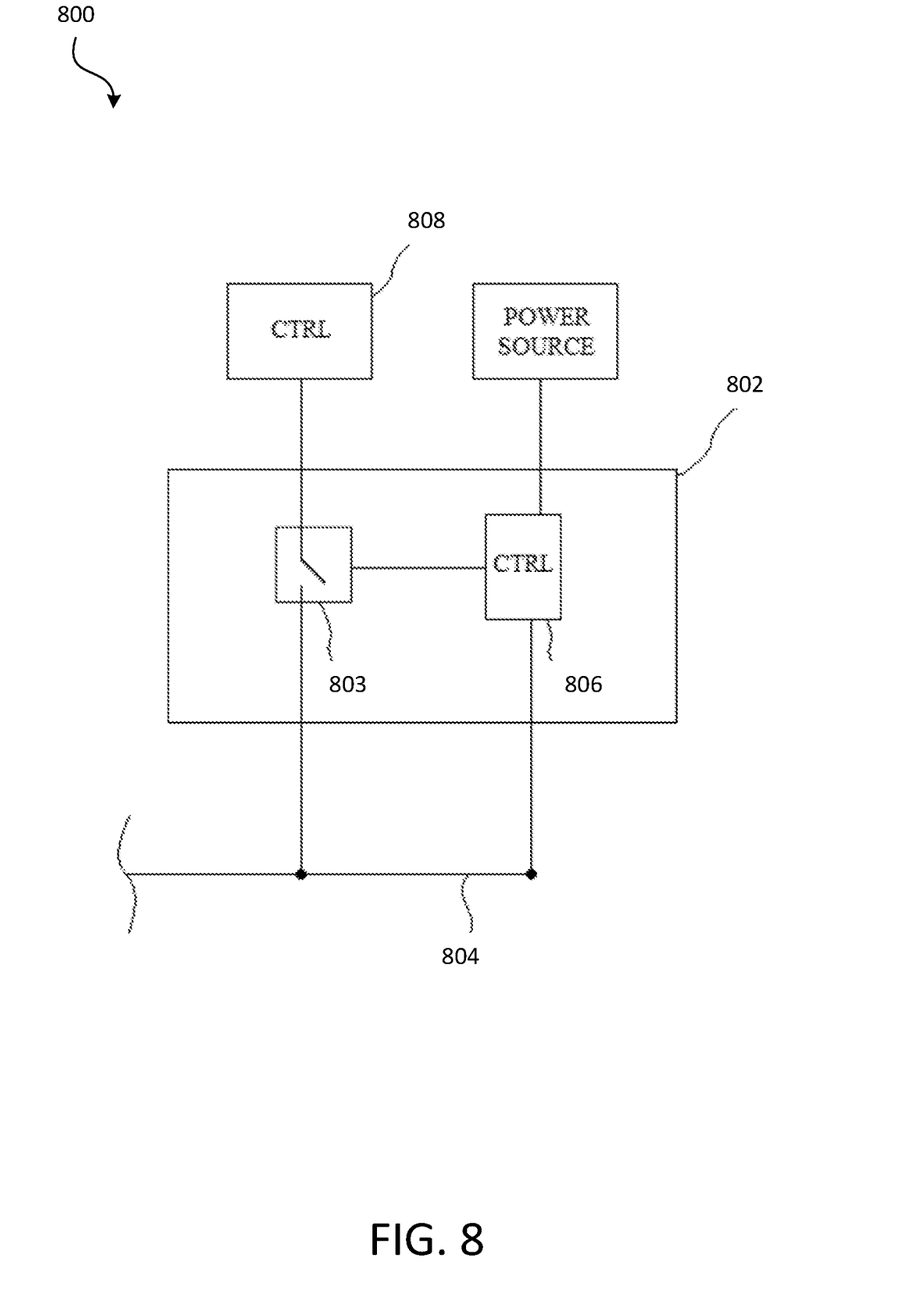
FIG. 8 is a block diagram of an embodiment of a thermal bypass circuit.

FIG. 8 illustrates a block diagram of a bypass control circuit 800. The bypass control circuit 800 is configured to operate with power supplies having a rectified DC output. The bypass control module 802 contains a switch 803 and a control 806. Switch 803 is electrically connected to Vout of the voltage divider within control 806 described in FIG. 7 and to return line 804. The control 806 of switch 803 is electrically connected to control 808. Control 808 is electrically connected to a power source, the return line 804, and the control 806 of switch 803. Control 808 contains a Zener diode configured for voltage regulation. The cathode of control 808 is electrically connected to a resistor. The resistor is electrically connected to a power source. The cathode of the Zener diode is also electrically connected to input a thermal type voltage divider. The anode of the Zener diode is electrically connected to the return line 804. Vout of the voltage divider is electrically connected to the control of switch 803 and a fixed resistor electrically connected to the return line 804. The thermal type voltage divider consists of a thermal resistor and a fixed resistor.

In an embodiment, a bypass of the indicator may be desired. For example, when a power source, such as a transformer, reaches a predetermined temperature, the indicator may be bypassed. In an example embodiment, the temperature sensor thermal resistor can be placed proximate to the transformer or other heat producing components for temperature sensing.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present invention, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A power output system comprising:
  a power supply including:
    an electrical transformer;
    a supply line electrically connected to an output of the electrical transformer; and
    a return line electrically connected to a ground;
  a control circuit including:
    a supply switch comprising:
      a first silicon controlled rectifier (SCR) including an anode, a cathode, and a gate, wherein the anode of the first SCR is electrically connected to the supply line of the power supply;
      a load connection electrically connected to the cathode of the supply switch SCR; and
      a control line electrically connected to the gate of the first SCR and to the supply line of the power supply; and
    a thermal control circuit comprising:
      a voltage adjustment circuit comprising:
        an input lead electrically connected to the load connection of the supply switch;
        an output lead; and
        a first Zener diode electrically connected to the input lead, the output lead, and the return line of the power supply; and
      a thermal sensor comprising:
        a second SCR including an anode, a cathode, and a gate;
        wherein the anode of the second SCR is electrically connected to the control line of the control circuit, and the cathode of the second SCR is electrically connected to the return line of the power supply;

a negative temperature coefficient thermistor, including an input lead and an output lead; and wherein the input lead of the negative temperature coefficient thermistor is electrically connected to the output lead of the voltage adjustment circuit, and the output lead of the negative temperature coefficient thermistor is electrically connected to the gate of the second SCR.

2. The power output system of claim 1, further comprising:

a voltage regulation circuit comprising:
a third SCR including an anode, a cathode, and a gate;
wherein the anode of the voltage regulation SCR is electrically connected to the control line of the control circuit, and the cathode of the third SCR is electrically connected to the return line of the power supply;
a potentiometer including an input terminal, an output terminal, and a ground terminal;
wherein the input terminal of the potentiometer is electrically connected to the load connection of the control circuit and the ground terminal of the potentiometer is electrically connected to the return line of the power supply;
a second Zener diode including an anode and a cathode; and
wherein the anode of the second Zener diode is electrically connected through a first resistor to the return line of the power supply and the anode of the second Zener diode is electrically connected through a second resistor to the gate of the third SCR, and the cathode of the second Zener diode is electrically connected to the output terminal of the voltage regulation circuit potentiometer.

3. The power output system of claim 1, further comprising:

a voltage cut in (VCI) circuit comprising:
a fourth SCR including an anode, a cathode, and a gate, wherein the anode of the fourth SCR is electrically connected to the control line of the control circuit, and
the cathode of the fourth SCR is electrically connected to the return line of the power supply;
a VCI control line electrically connected between the supply line of the power supply and the gate of the fourth SCR;
a third Zener diode including an anode and a cathode, wherein the cathode of the third Zener diode is electrically connected to the load connection of the control circuit; and
an electrical switch including a collector, an emitter, and a base,
wherein the collector of the electrical switch is electrically connected to the VCI control line, the emitter of the electrical switch is electrically connected to the return line of power supply, and the base of the electrical switch is electrically connected to the anode of the third Zener diode.

4. The power output system of claim 1, further comprising indicator lights electrically configured to convey information regarding the operational status of the power output system.

5. The power output system of claim 1, wherein the control circuit comprises a temperature switching threshold and is capable of receiving a temperature signal from a temperature sensor; wherein, based on the signal from the temperature sensor being at or above the temperature switching threshold, the switching circuit is configured to electrically disconnect the supply line of the power supply from the load connection and electrically connect the supply line to a return path, the return path electrically connected to the return line and bypassing the load connection; and wherein, based on the signal from the temperature sensor being below the temperature switching threshold, the switching circuit is configured to electrically connect the supply line of the power supply to the load connection and disconnect the supply line from the return path.

6. The power output system of claim 5, wherein the switching threshold corresponds to a maximum operating temperature of the transformer.

7. The power output system of claim 5, wherein the switching threshold corresponds to a maximum ambient temperature of the power output system.

8. A power output system comprising:

a power supply including:
an electrical transformer;
a supply line electrically connected to an output of the electrical transformer; and
a return line electrically connected to a ground;
a control circuit including:
a supply switch comprising:
a first silicon controlled rectifier (SCR) including an anode, a cathode, and a gate, wherein the anode of the first SCR is electrically connected to the supply line of the power supply;
a load connection electrically connected to the cathode of the first SCR;
a control line electrically connected to the gate of the first SCR and to the supply line of the power supply; and
a voltage regulation circuit comprising:
a second silicon controlled rectifier (SCR) including an anode, a cathode, and a gate, wherein the anode of the second SCR is electrically connected to the control line of the control circuit, and the cathode of the second SCR is electrically connected to the return line of the power supply;
a potentiometer including an input terminal, an output terminal, and a ground terminal;
wherein the input terminal of the potentiometer is electrically connected to the load connection of the control circuit and the ground terminal of the potentiometer is electrically connected to the return line of the power supply;
a first Zener diode including an anode and a cathode; and
wherein the anode of the first Zener diode is electrically connected through a first resistor to the return line of the power supply and the anode of the first Zener diode is electrically connected through a second resistor to the gate of the second SCR, and the cathode of the first Zener diode is electrically connected to the output terminal of the voltage regulation circuit potentiometer.

9. The power output system of claim 8, further comprising:

a voltage cut in (VCI) circuit comprising:
a third SCR including an anode, a cathode, and a gate, wherein the anode of the third SCR is electrically connected to the control line of the control circuit, and the cathode of the third SCR is electrically connected to the return line of the power supply, and the gate of the third SCR is electrically connected to the supply line of the power supply;

a VCI control line electrically connected to the supply line of the power supply and the gate of the third second SCR;

a second Zener diode including an anode and a cathode, wherein the cathode of the second Zener diode is electrically connected to the load connection of the control circuit; and an electrical switch including a collector, an emitter, and a base, wherein the collector of the electrical switch is electrically connected to the VCI control line, the emitter of the electrical switch is electrically connected to the return line of power supply, and the base of the electrical switch is electrically connected to the anode of the second Zener diode.

10. A power output system comprising:
a power supply including:
   an electrical transformer;
   a supply line electrically connected to an output of the electrical transformer; and
   a return line electrically connected to a ground;
a control circuit including:
   a supply switch comprising:
      a first silicon controlled rectifier (SCR) including an anode, a cathode, and a gate, wherein the anode of the first SCR is electrically connected to the supply line of the power supply;
      a load connection electrically connected to the cathode of the first SCR;
      a control line electrically connected to the gate of the first SCR and to the supply line of the power supply; and
a voltage cut in (VCI) circuit comprising:
   a second silicon controlled rectifier (SCR) including an anode, a cathode, and a gate, wherein the anode of the second SCR is electrically connected to the control line of the control circuit, and the cathode of the second SCR is electrically connected to the return line of the power supply, and the gate of the second SCR is electrically connected to the supply line of the power supply;
   a VCI control line electrically connected to the supply line of the power supply and the gate of the second first SCR;
   a first Zener diode including an anode and a cathode, wherein the cathode of the first Zener diode is electrically connected to the load connection of the control circuit; and
   an electrical switch including a collector, an emitter, and a base,
   wherein the collector of the electrical switch is electrically connected to the VCI control line, the emitter of the electrical switch is electrically connected to the return line of power supply, and the base of the electrical switch is electrically connected to the anode of the first Zener diode.

11. A power output system comprising:
a power supply including:
   an electrical transformer;
   a supply line electrically connected to the output of the electrical transformer; and
   a return line electrically connected to a ground;
a control circuit including:
   a supply switch comprising:
      a first silicon controlled rectifier (SCR) including an anode, a cathode, and a gate, wherein the anode of the first SCR is electrically connected to the supply line of the power supply;
      a load connection electrically connected to the cathode of the first SCR;
      a control line electrically connected to the gate of the first SCR and to the supply line of the power supply;
   a voltage regulation indication circuit comprising:
      a first switch comprising a transistor including a drain, a source, and a gate, wherein the drain is electrically connected to a control, the source is electrically connected to the return line of the power supply, and the gate is electrically connected to a first control;
      the first control comprising a Zener diode including an anode and a cathode, the anode is electrically connected to the gate of the first switch and to the return line of the power supply, and the cathode is connected to the output of a voltage divider and to a capacitor electrically connected to the return line, wherein the first control is capable of receiving an input from a power source through a diode including an anode and a cathode, the anode of the diode is electrically connected to the power supply line and the cathode is electrically connected to the voltage divider input; and
      the voltage divider electrically connected to the return line of the power supply.

12. The power output system of claim 11, further comprising a bypass control module comprising:
   a second switch comprising a first silicon controlled rectifier (SCR) including an anode, a cathode, and a gate, the anode electrically connected to the output of the voltage divider, the cathode electrically connected to the return line of the power supply, and the gate is electrically connected to a second control; and
   the second control comprising a voltage divider comprising a temperature sensor thermal resistor electrically connected to a power source and to the gate of the second switch and to a resistor electrically connected to the return line.

13. The power output system of claim 12, wherein the voltage divider output is electrically connected to the return line at a predetermined temperature.

14. The power output system of claim 11, further comprising an indicator light electrically connected to a power source and to the drain of the first switch.

15. The power output system of claim 11, wherein the control comprises a capacitor.

16. The power output system of claim 11, wherein the control comprises a Zener diode.

17. The power output system of claim 11, wherein the voltage divider is configured to produce a predetermined threshold voltage.

18. The power output system of claim 17, wherein the voltage divider comprises a thermal resistor and a fixed resistor.

19. The power output system of claim 11, further comprising a thermal bypass, wherein when a power source reaches a predetermined temperature, the thermal bypass causes the voltage regulation indication circuit to be bypassed.

20. The power output system of claim 11, wherein the transistor is a mosfet.

* * * * *